(12) United States Patent  
Inoue et al.

(10) Patent No.: US 9,159,664 B2  
(45) Date of Patent: Oct. 13, 2015

(54) SEMICONDUCTOR DEVICE

(75) Inventors: Yushi Inoue, Tokyo (JP); Yukitoshi Hirose, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 698 days.

(21) Appl. No.: 13/178,093

(22) Filed: Jul. 7, 2011

(65) Prior Publication Data

US 2012/0261837 A1    Oct. 18, 2012

(30) Foreign Application Priority Data

Apr. 14, 2011 (JP) ................................. 2011-090200

(51) Int. Cl.
    *H01L 23/48*      (2006.01)
    *H01L 23/498*     (2006.01)
    *H01L 23/64*      (2006.01)
    *H01L 23/00*      (2006.01)
    *H01L 25/065*     (2006.01)
    *H01L 23/31*      (2006.01)

(52) U.S. Cl.
    CPC .......... *H01L 23/49838* (2013.01); *H01L 23/64* (2013.01); *H01L 24/49* (2013.01); *H01L 25/0657* (2013.01); *H01L 23/3128* (2013.01); *H01L 24/48* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49171* (2013.01); *H01L 2224/49175* (2013.01); *H01L 2224/73265* (2013.01); *H01L 2225/0651* (2013.01); *H01L 2225/06506* (2013.01); *H01L 2225/06527* (2013.01); *H01L 2225/06562* (2013.01); *H01L 2225/06575* (2013.01); *H01L 2924/0102* (2013.01); *H01L 2924/014* (2013.01); *H01L 2924/01005* (2013.01); *H01L 2924/01006* (2013.01); *H01L 2924/01033* (2013.01); *H01L 2924/15311* (2013.01)

(58) Field of Classification Search
    USPC .................. 257/668, 777, 778, 781, 786, 787
    See application file for complete search history.

(56) References Cited

U.S. PATENT DOCUMENTS

| | | | | |
|---|---|---|---|---|
| 5,264,842 A * | 11/1993 | Franaszek | ..................... | 340/2.25 |
| 7,541,680 B2 * | 6/2009 | Kwon et al. | .................. | 257/777 |
| 7,608,925 B2 * | 10/2009 | Takinomi | ...................... | 257/724 |
| 7,687,921 B2 * | 3/2010 | Hiew et al. | .................... | 257/777 |
| 8,044,518 B2 * | 10/2011 | Uchida | ......................... | 257/773 |
| 2001/0020735 A1 * | 9/2001 | Chikawa et al. | ............. | 257/678 |
| 2003/0071649 A1 * | 4/2003 | Dankowski et al. | .......... | 324/765 |
| 2004/0150084 A1 * | 8/2004 | Nishida et al. | ................ | 257/678 |
| 2009/0085223 A1 * | 4/2009 | Nishiyama et al. | ........... | 257/777 |
| 2009/0121336 A1 * | 5/2009 | Kim | .............................. | 257/686 |

FOREIGN PATENT DOCUMENTS

JP      2010-45166 A    2/2010

* cited by examiner

*Primary Examiner* — Ori Nadav

(57) ABSTRACT

A semiconductor device may include, but is not limited to: a wiring hoard; and first and second chips stacked over the wiring board. The wiring board includes a plurality of first data terminals and a plurality of second data terminals. One of the first and second chips is sandwiched between the wiring board and the other of the first and second chips. The first chip includes a plurality of first data pads. The second chip includes a plurality of second data pads and a plurality of third data pads. The first data terminals of the wiring board are electrically connected respectively to the first data pads of the first chip and further respectively to the second data pads of the second chip. The second data terminals are electrically connected respectively to the third data pads of the second chip and electrically disconnected from the first chip.

6 Claims, 20 Drawing Sheets

SEMICONDUCTOR DEVICE

BACKGROUND OF THE INVENTION

1. Field of the Invention

The present invention relates to a semiconductor device.

Priority is claimed on Japanese Patent Application No. 2011-090200, filed Apr. 14, 2011, the content of which is incorporated herein by reference.

2. Description of the Related Art

In recent years, to achieve high speed, high density, and multiple functionality in semiconductor devices, research and development have been done in chip-on-chip (hereinafter, CoC) technology, by which a plurality of semiconductor chips are stack-mounted onto a wiring substrate. The CoC technology is also referred to as multichip packaging (hereinafter, MCP) technology.

A semiconductor device using the MCP technology (hereinafter, MCP semiconductor device) includes a wiring substrate and a plurality of semiconductor chips stack-mounted onto the wiring substrate. The plurality of semiconductor chips are connected by flip-chip connection or by wire bonding connection (see, for example, Japanese Patent Laid-Open Publication No. 2010-45166).

In general, the wiring substrate used in an MCP semiconductor device includes: a main substrate; a first wiring pattern disposed on one surface of the main substrate and electrically connected to a semiconductor memory chip via bonding wires; a second wiring pattern (a pattern of wires, land portions, and the like) that is disposed on the other surface of the main substrate, and onto which external connection terminals (for example, solder balls) are disposed; and through electrodes which penetrating the main substrate and which are connected to the first and second wiring patterns.

In the case of stack-mounting a plurality of semiconductor memory chips onto a wiring substrate configured in this manner, it is necessary to branch the wires for signals such as I/O. For this reason, the influence of multiple reflections causes deterioration of quality of the waveforms of data signals.

In other words, in the above MCP semiconductor device, depending upon the sequence of stacking the semiconductor chips onto the wiring substrate and the wiring topology of the wiring substrate, there has been the problem of deterioration of the data signal quality.

SUMMARY

In one embodiment, a semiconductor device may include, but is not limited to: a wiring board; and first and second chips stacked over the wiring board. The wiring board includes a plurality of first data terminals and a plurality of second data terminals. One of the first and second chips is sandwiched between the wiring board and the other of the first and second chips. The first chip includes a plurality of first data pads. The second chip includes a plurality of second data pads and a plurality of third data pads. The first data terminals of the wiring board are electrically connected respectively to the first data pads of the first chip and further respectively to the second data pads of the second chip. The second data terminals are electrically connected respectively to the third data pads of the second chip and electrically disconnected from the first chip.

In another embodiment, a semiconductor device may include, but is not limited to: a wiring board; first, second, and third chips over the wiring board; and a sealing resin housing the first, second, and third chips therein. The wiring board includes a plurality of first data terminals and a plurality of second data terminals. The first chip is configured to supply or receive first data signals respectively to or from the first data terminals of the wiring board. The second chip is configured to supply or receive second data signals respectively to or from the first and second data terminals of the wiring hoard. The third chip is configured to supply or receive third data signals respectively to or from the second data terminals of the wiring board. Supplying or receiving the first data signals respectively to or from the first data terminals of the wiring board is performed in parallel to supplying or receiving the third data signals respectively to or from the second data terminals of the wiring hoard.

In another embodiment, a semiconductor device may include, but is not limited to: a wiring board; first, second, and third chips stacked over the wiring board; and a sealing resin cooperating with the wiring board to house the first, second, and third chips therein. The wiring board includes first and second chip select terminals which receive first and second chip select signals, respectively. The first and third chips are connected to the first chip select terminal and disconnected from the second chip select terminal so that the first and second chips are activated simultaneously in response to the first chip select signal from the first chip select terminal. The second chip is sandwiched between the first and third chips. The second chip is connected to the second chip select terminal and disconnected from the first chip select terminal so that the second chip is activated in response to the second chip select signal from the second chip select terminal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
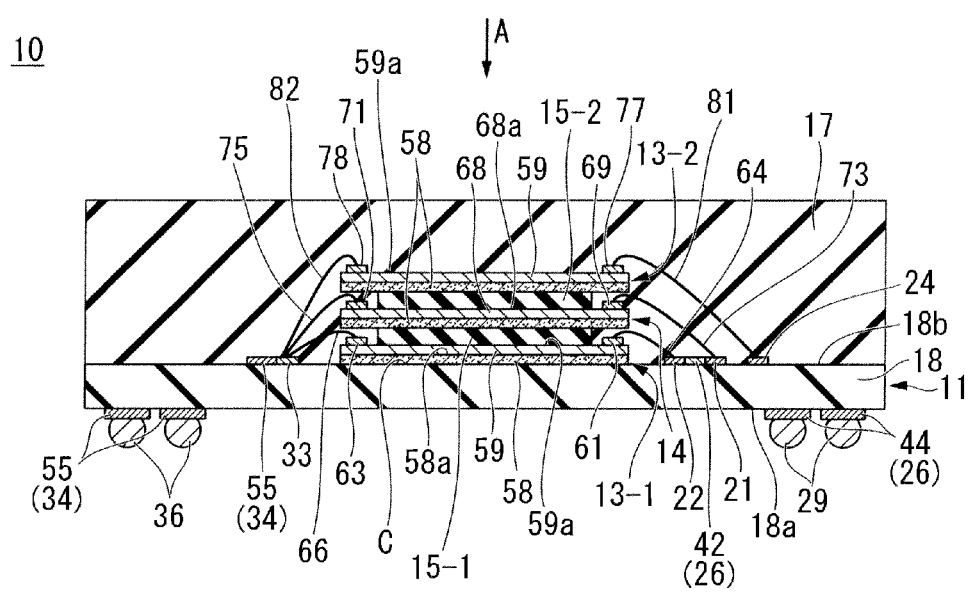
FIG. 1 is a cross-sectional view illustrating a configuration of a semiconductor device according to a first embodiment of the present invention.

FIG. 1 is a cross-sectional view illustrating a configuration of a semiconductor device 10 according to a first embodiment of the present invention. The cross-section of the semiconductor device 10 shown in FIG. 1 corresponds to a cross-section taken along a line B-B shown in FIG. 2, which is described later.

Referring to FIG. 1, the semiconductor device 10 includes: a first wiring substrate 11; a second semiconductor chip 13-1; a first semiconductor chip 14; a third semiconductor chip 13-2; a first spacer 15-1; a second spacer 15-2; and a sealing resin 17.

Figure 2:
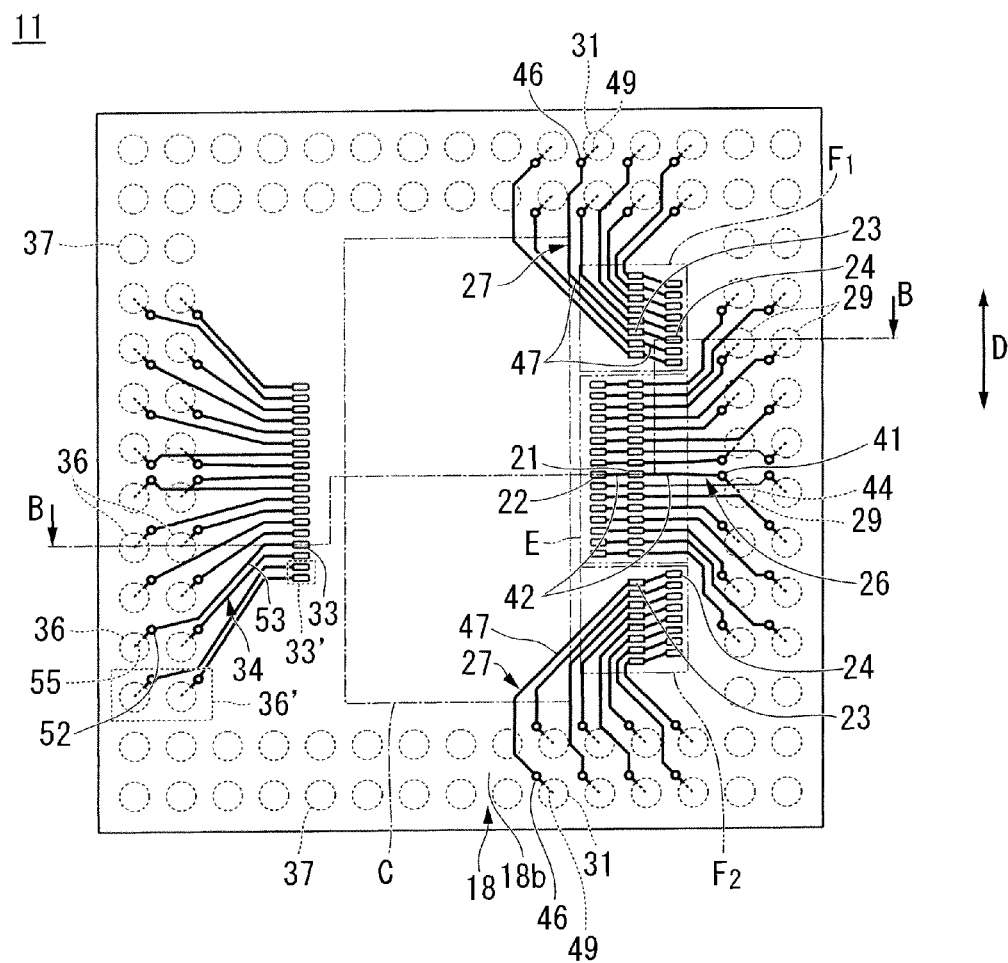
FIG. 2 is a plan view illustrating a wiring substrate shown in FIG. 1.

FIG. 2 is a plan view illustrating the wiring substrate shown in FIG. 1, which is viewed in a direction A shown in FIG. 1. A direction D shown in FIG. 2 indicates a first direction. Like reference numerals denote like elements between FIGS. 1 and 2.

Referring to FIGS. 1 and 2, the first wiring substrate 11 includes: a main substrate 18; n pieces of first internal data terminals 21 (where n is an integer of two or larger); n pieces of second internal data terminals 22; n pieces of third internal data terminals 23; n pieces of fourth internal data terminals 24; a first wiring pattern (first signal path) 26; a second wiring pattern (second signal path) 27; n pieces of first external data terminals 29; n pieces of second external data terminals 31; a plurality of internal CA (command/address) terminals 33; chip select internal terminals 33'; a third wiring pattern (third signal path) 34; external CA terminals 36; chip select external terminals 36'; and external connection terminals 37. In the first embodiment, a case where n=8 is explained.

Referring to FIG. 1, the main substrate 18 includes, for example, an insulating board. For example, a fiberglass epoxy substrate can be used as the main substrate 18. The main substrate 18 has: a first surface 18a (surface corresponding to a first surface of the first wiring substrate 11); and a second surface 18b provided on the opposite side from the first surface 18a (surface corresponding to a second surface of the first wiring substrate 11).

Referring to FIG. 2, the second surface 18b of the wiring substrate 18 has: a chip mounting region C; a center region E; a first peripheral region F1; and a second peripheral region F2.

The chip mounting region C is a rectangular region disposed in the center part of the second surface 18b. The chip mounting region C is the region in which the first to third semiconductor chips 14, 13-1, and 13-2 are stack-mounted.

The center region E and the first and second peripheral regions F1 and F2 are disposed along the D direction on one side of the chip mounting region C. The center region E is positioned between the first and second peripheral regions F1 and F2.

Figure 3:
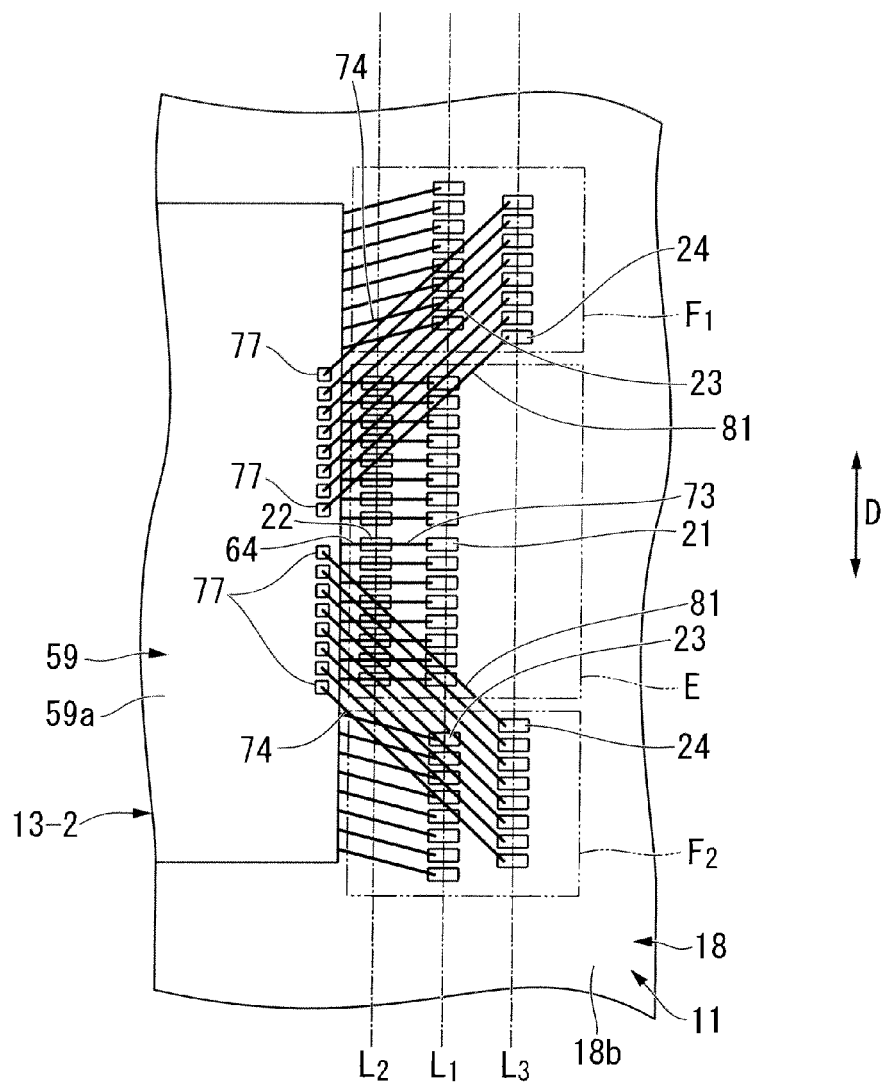
FIG. 3 is a plan view illustrating the semiconductor device of the first embodiment, from which a sealing resin shown in FIG. 1 is removed.

FIG. 3 is a plan view illustrating the semiconductor device 10 from which the sealing resin shown in FIG. 1 is removed, which is viewed in the direction A shown in FIG. 1. The first and second wiring patterns 26 and 27 shown in FIG. 2 are omitted in FIG. 3. Like reference numerals denote like elements among FIGS. 1 to 3.

Referring to FIG. 3, the n pieces of the first internal data terminals 21 are provided in the center region E. The n pieces of the first internal data terminals 21 are aligned on a first straight line $L_1$ that extends over the center region E in the direction D in plan view.

The n pieces of the second internal data terminals 22 are provided in the center region E. The n pieces of the second internal data terminals 22 are aligned on a first straight line $L_2$ that extends in the direction D (i.e., in parallel to the first straight line $L_1$). The second straight line $L_2$ is disposed on the second surface 18b and positioned between the first straight line $L_1$ and the third semiconductor chip 13-2.

Among the n pieces of the third internal data terminals 23, n/2 pieces of the third internal data terminals 23 are provided on the first peripheral region $F_1$. The other n/2 pieces of the third internal data terminals 23 are provided on the second peripheral region $F_2$. The n pieces of the third internal data terminals 23 are disposed on the first straight line $L_1$.

Among the n pieces of the fourth internal data terminals 24, n/2 pieces of the fourth internal data terminals 24 are provided on the first peripheral region $F_1$. The other n/2 pieces of the fourth internal data terminals 24 are provided on the second peripheral region $F_2$. The n pieces of the fourth internal data terminals 24 are disposed on the third line $L_3$ that extends in the direction D (i.e., in parallel to the first line $L_1$). The line $L_1$ is disposed between the second line $L_2$ and the third line $L_3$.

Referring to FIG. 2, the first wiring pattern (first signal path) 26 includes: a first through electrode 41; a first wire 42; and a second wire 44. The first through electrode 41 is disposed so as to penetrate through the main substrate 18. The first wire 42 is provided on the second surface 18b of the main substrate 18. The first wire 42 connects the first internal data terminal 21, the second internal data terminal 22, and one end of the first through electrode 41. Thus, the first wire 42 electrically connects the first internal data terminal 21, the second internal data terminal 22, and the first through electrode 41.

The second wire 44 is provided on the first surface 18a of the main substrate 18. The second wire 44 includes a land portion at which a first external data terminal 29 is disposed.

The second wire 44 is connected to the other end of the first through electrode 41. Thus, the second wire 44 is electrically connected to the first wire 42 via the first through electrode 41.

Figure 4:
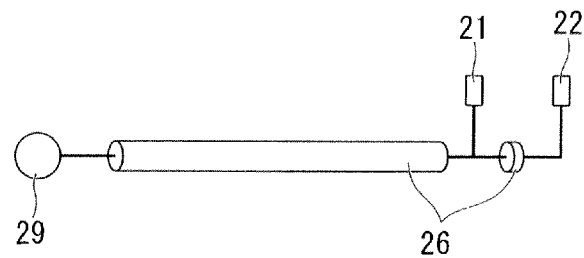
FIG. 4 illustrates a first external data terminal, a first wiring pattern, a first internal data terminal, and a second internal data terminal.

FIG. 4 illustrates a first external data terminal, a second wiring pattern, a first internal data terminal, and a second internal data terminal, which are shown in FIG. 2. Referring to FIG. 4, the first wiring pattern 26 is a wiring pattern substantially free of branching portions. Thus, there is almost no stub by the use of the first wiring pattern 26, thereby preventing the deterioration of signal quality.

Referring to FIG. 2, the n pieces of the second wiring patterns (second signal paths) 27 are provided, each including a second through electrode 46, a third wire 47, and a fourth wire 49. The second through electrode 46 is disposed so as to penetrate through the main substrate 18. The third wire 47 is provided on the second surface 18b of the main substrate 18. The third wire 47 connects the third internal data terminal 23, the fourth internal data terminal 24, and one end of the second through electrode 46. Thus, the third wire 47 electrically connects the third internal data terminal 23, the fourth internal data terminal 24, and the second through electrode 46.

The fourth wire 49 is disposed on the first surface 18a of the main substrate 18. The fourth wire 49 has a land portion on which a second external data terminal 31 is disposed. The fourth wire 49 is connected to the other end of the second through electrode 46. Thus, the fourth wire 49 is electrically connected to the third wire 47 via the second through electrode 46. The second wiring pattern 27 is a wiring pattern substantially free of branching portions.

The n pieces of the first external data terminals 29 are provided on the land portions of the second wires 44. Thus, each of the first external data terminals 29 is electrically connected to the first and second internal data terminals 21 and 22 via the first wiring pattern 26. Solder balls, for example, can be used as the first external data terminals 29.

The n pieces of the second external data terminals 31 are provided on the land portions of the fourth wires 49. Thus, each of the second external data terminals 31 is electrically connected to the third and fourth internal data terminals 23 and 24 via the second wiring patterns 27. Solder balls, for example, can be used as the second external data terminals 31.

A plurality of internal CA terminals 33 are provided on the second surface 18b positioned on the opposite side with respect to the chip mounting region C. The plurality of internal CA terminals 33 are arranged in one line in the direction D.

The n pieces of the third wiring patterns (third signal paths) 34 are provided, each including a third through electrode 52, a fifth wire 53, and a sixth wire 55. The third through electrode 52 is provided so as to penetrate through the main substrate 18. The fifth wire 53 is provided on the second surface 18b of the main substrate 18. The fifth wire 53 connects the internal CA terminal 33 and one end of the third through electrode 52. Thus, the fifth wire 53 is electrically connected to the internal CA terminal 33 and the third through electrode 52.

Referring to FIG. 1, the sixth wire 55 is disposed on the first surface 18a of the main substrate 18. The sixth wire 55 has a land portion on which the external CA terminal 36 is disposed. Referring to FIG. 2, the sixth wire 55 is connected to the other end of the third through electrode 52. Thus, the sixth wire 55 is electrically connected to the fifth wire 53 via the third through electrode 52.

Referring to FIGS. 1 and 2, the external CA terminal 36 is provided on a land portion of the sixth wire 55. Thus, the external CA terminal 36 is electrically connected to the internal CA terminal 33 via the third wiring pattern 34. Solder balls, for example, can be used as the external CA terminals 36.

The plurality of the external connection terminals 37 shown in FIG. 2 are provided on the first surface 18a (not shown in FIG. 2) of the main substrate 18. The external connection terminals 37 are terminals to which power, a clock, and the like are input. Solder balls, for example, can be used as the external connection terminals 37.

Referring to FIG. 1, the second semiconductor chip 13-1 has an edge pad structure. The second semiconductor chip 13-1 includes: a semiconductor substrate 58; a circuit element layer 59 over the semiconductor substrate 58; and n pieces of second data pads 61 and a plurality of CA pads 63 on the circuit element layer 59.

The second semiconductor chip 13-1 is adhered to the chip mounting region C so that the second data pads 61 and the CA pads 63 face upward. The circuit element layer 59 is provided on the surface 58a of the semiconductor substrate 58 (for example, a silicon substrate). The circuit element layer 59 includes circuit elements, such as transistors (not shown).

Figure 5:
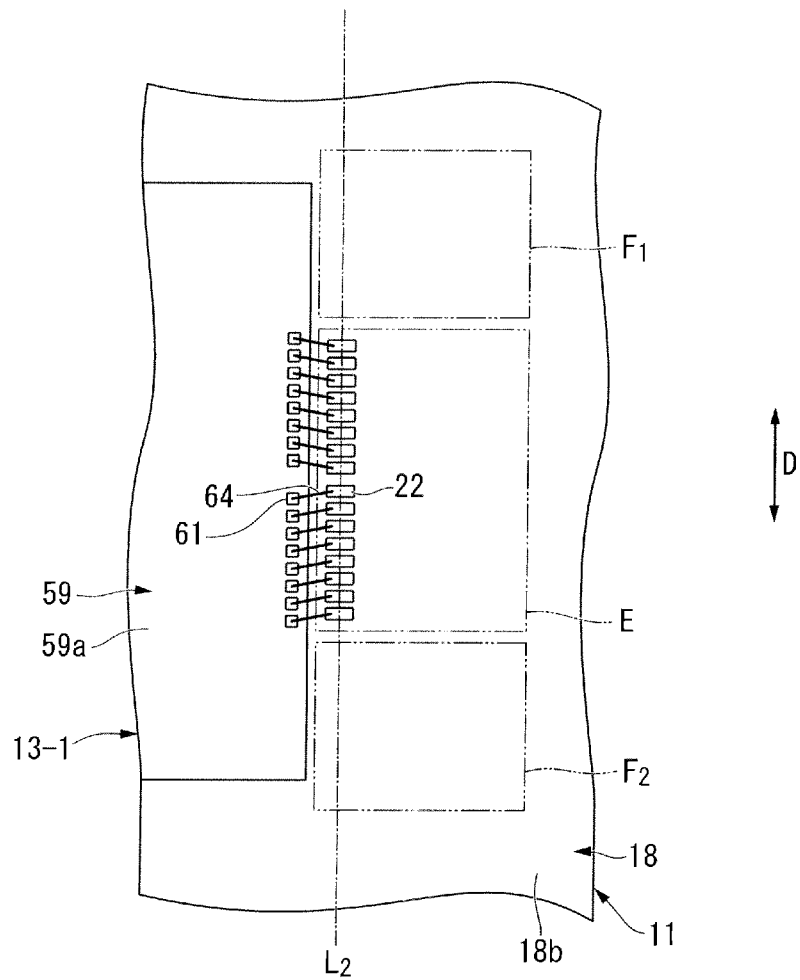
FIG. 5 is a plan view illustrating the positions of second data pads on a second semiconductor chip shown in FIG. 1.

FIG. 5 is a plan view illustrating the positions of the second data pads provided on the second semiconductor chip shown in FIG. 1. For a convenience of explanations, only the second semiconductor chip 13-1 of the semiconductor device 10 of the first embodiment and part of the constituent elements of the first wiring substrate 11 (specifically, the main substrate 18 and the second internal data terminals 22) are shown in FIG. 5. Like reference numerals denote like elements among FIGS. 1, 3, and 5.

Referring to FIG. 5, the n pieces of the second data pads 61 on the surface 59a of the circuit element layer 59 are arranged in the direction D, along one side of the second semiconductor chip 13-1. The n pieces of the second data pads 61 are disposed adjacent to the center region E in plan view. The second data pads 61 are electrically connected to circuit elements (not shown) provided on the circuit element layer 59.

Referring to FIGS. 1 and 5, the n pieces of the second data pads 61 are connected to respective ones of the second internal data terminals 22 by bonding wires 64. Thus, the second data pads 61 are electrically connected to respective ones of the first external data terminals 29 via the bonding wires 64 and the first wiring patterns 26 (see FIG. 2). Referring to FIG. 2, the n pieces of the second data pads 61 are electrically separated (insulated) from the n pieces of the second external data terminals 31.

Referring to FIG. 1, the plurality of CA pads 63 are provided on the surface 59a of the circuit element layer 59, along another side of the second semiconductor chip 13-1, which is opposite from the side along which the second data pads 61 are arranged. Although not illustrated, the plurality of CA pads 63 are arranged in the direction D shown in FIG. 5. The CA pads 63 are electrically connected to the circuit elements (not illustrated) that are provided on the circuit element layer 59.

The plurality of CA pads 63 are connected to respective ones of internal CA terminals 33 by bonding wires 66. Thus, the CA pads 63 are electrically connected to respective ones of the external CA terminals 36 via the bonding wires 66 and the third wiring patterns 34 (see FIG. 2).

For example, a semiconductor memory chip, or a controller other than a memory, can be used as the second semiconductor chip 13-1. A DRAM (dynamic random access memory), SRAM (static random access memory), PRAM (phase-change memory), a flash memory, or the like can be used as the semiconductor memory chip. In the first embodiment, a case, in which a 16-bit I/O DRAM (2-Gbit capacity) is used as the second semiconductor chip 13-1, is explained below.

Referring to FIG. 1, the first semiconductor chip 14 has an edge pad structure. The first semiconductor chip 14 has the same structure as that of the second semiconductor chip 13-1 except that 2n pieces of first data pads 69, and a plurality CA pads 71 are provided on a circuit element layer 68 of the second semiconductor chip 13-1, in lieu of the n pieces of the second data pads 61 and the plurality of CA pads 63 which are provided on the circuit element layer 59 of the second semiconductor chip 13-1.

The circuit element layer 68 includes circuit elements, such as transistors (not illustrated). The first spacer 15-1 is a member that prevents the first semiconductor chip 14 from contacting the bonding wires 64 and 66. The first semiconductor chip 14 is disposed between the second semiconductor chip 13-1 and the third semiconductor chip 13-2.

Figure 6:
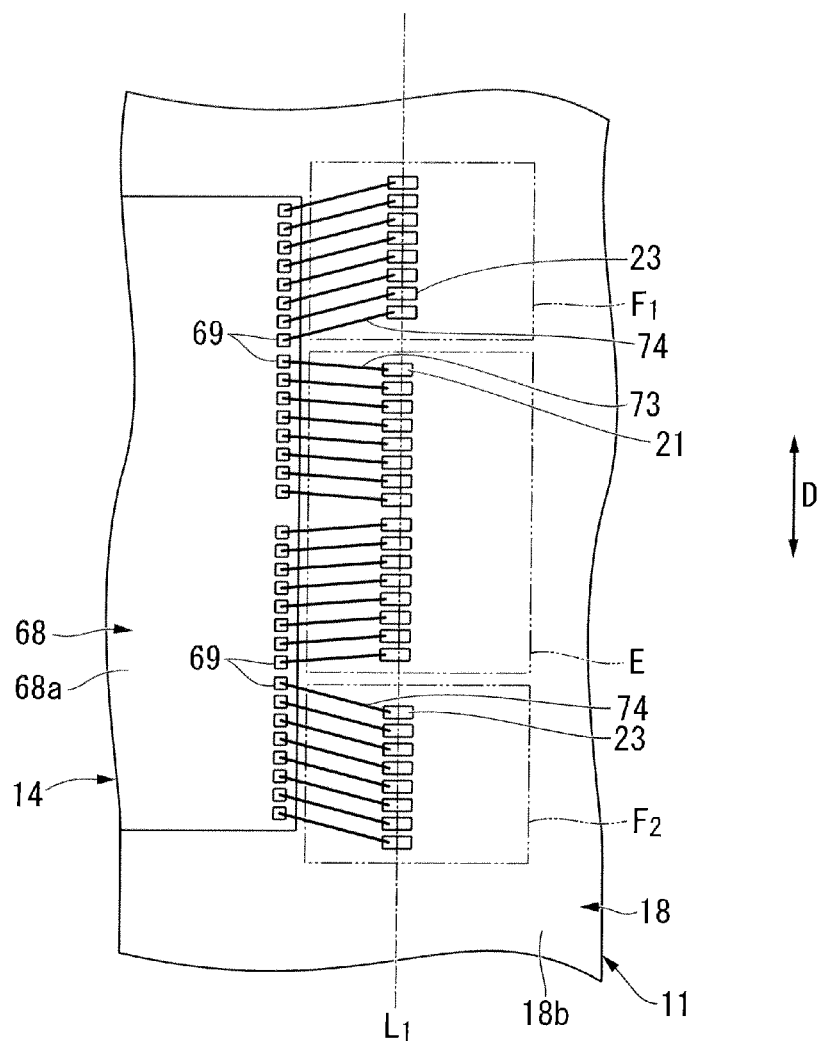
FIG. 6 is a plan view illustrating the positions of first data pads on a first semiconductor chip shown in FIG. 1.

FIG. 6 is a plan view illustrating the positions of the first data pads provided on the first semiconductor chip shown in FIG. 1. For convenience of explanations, only the first semiconductor chip 14 of the semiconductor device 10 of the first embodiment and part of the constituent elements of the first wiring substrate 11 (specifically, the main substrate 18, the first internal data terminals 21, and the third internal data terminals 23) are shown in FIG. 6. Like reference numerals denote like elements among FIGS. 1, 3, and 6.

Referring to FIG. 6, the 2n pieces of the first data pads 69 are arranged in the direction D, on the surface 68a of the circuit element layer 68, along one side of the first semiconductor chip 14. Among the 2n pieces of the first data pads 69, n pieces of the first data pads 69 are disposed adjacent to the center region E. The other n pieces of the first data pads 69 are adjacent to the first and second peripheral regions $F_1$ and $F_2$. The first data pads 69 are electrically connected to circuit elements (not illustrated) provided on the circuit element layer 59.

Referring to FIGS. 1 and 6, the n pieces of the first data pads 69 are connected to respective ones of the first internal data terminals 21 by bonding wire 73. Thus, the first data pads 69 are electrically connected to the first external data terminals 29 via the bonding wires 73 and the first wiring patterns 26 (see FIG. 2).

Referring to FIGS. 1 and 6, the other n pieces of the first data pads 69 are connected to respective ones of the third internal data terminals 23 by bonding wires 74. Thus, the n pieces of the first data pads 69 are electrically connected to the second external data terminals 31 via the bonding wires 74 and the second wiring patterns 27 (see FIG. 2).

Referring to FIG. 1, the plurality of CA pads 71 are provided on the surface 68a of the circuit element layer 68, along another side of the first semiconductor chip 14, which is opposite to the side along which the first data pads 69 are arranged. Although not illustrated, the plurality of CA pads 71 are arranged in the direction D shown in FIG. 6. The CA pads 71 are electrically connected to circuit elements (not illustrated) that are provided on the circuit element layer 68.

The plurality of CA pads 71 are connected to respective ones of the internal CA terminals 33 by bonding wires 75. Thus, the CA pads 71 are electrically connected to the external CA terminals 36 via the bonding wires 75 and the third wiring patterns 34 (see FIG. 2).

A semiconductor memory chip, and a controller other than a memory, can be used as the first semiconductor chip 14 having the above structure. A DRAM, SRAM, PRAM, a flash memory, or the like can be used as the semiconductor memory chip. In the first embodiment, a case, in which a 32-bit I/O DRAM (2-Gbit capacity) is used as the first semiconductor chip 14, is explained below.

Referring to FIG. 1, the third semiconductor chip 13-2 has an edge pad structure. The third semiconductor chip 13-2 has the same structure as that of the first semiconductor chip 13-1 except that n pieces of third data pads 77 and a plurality CA pads 78 are provided on the circuit element layer 59 of the second semiconductor chip 13-2, in lieu of the n pieces of the second data pads 61 and the plurality of CA pads 63 which are provided on the circuit element layer 59 of the first semiconductor chip 13-1.

The third semiconductor chip 13-2 is fixed onto a second spacer 15-2. The second spacer 15-2 is fixed onto the surface 68a of the circuit element layer 68 of the first semiconductor chip 14, so that the third data pads 77 and CA pads 78 face upward. The second spacer 15-2 is a member that prevents the third semiconductor chip 13-2 from contacting the bonding wires 73, 74, and 75.

Figure 7:
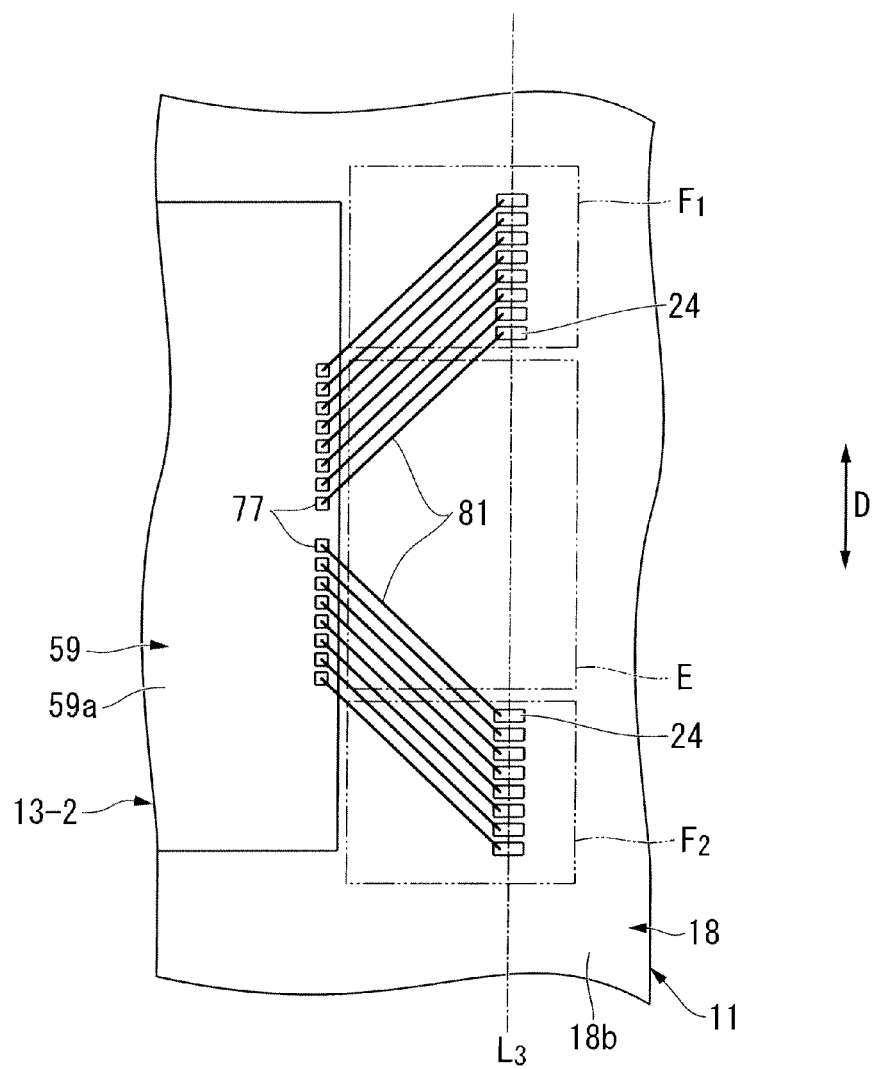
FIG. 7 is a plan view illustrating the positions of third data pads on a third semiconductor chip shown in FIG. 1.

FIG. 7 is a plan view illustrating the positions of the third data pads provided on the third semiconductor chip shown in FIG. 1. For a convenience of explanations, only the third semiconductor chip 13-2 of the semiconductor device 10 of the first embodiment, and part of the constituent elements of the first wiring substrate 11 (specifically, the main substrate 18 and the fourth internal data pads 24) are shown in FIG. 7. Like reference numerals denote like elements among FIGS. 1, 3, and 7.

Referring to FIG. 7, the n pieces of the third data pads 77 are arranged in the direction D, on the surface 59a of the circuit element layer 59, along one side of the semiconductor chip 13-2. The n pieces of the third data pads 77 are disposed adjacent to the center region E in plan view. The third data pads 77 are electrically connected to circuit elements (not illustrated) provided on the circuit element layer 59.

Referring to FIGS. 1 and 7, the n pieces of third data pads 77 are connected to respective ones of the fourth internal data terminals 24 by bonding wires 81. Thus, the third data pads 77 are electrically connected to the second external data terminals 31 via the bonding wires 81 and the second wiring patterns 27 (see FIG. 2). Referring to FIG. 2, the n pieces of the third data pads 77 are electrically separated (insulated) from the n pieces of the first external data pads 29.

Referring to FIG. 1, the plurality of CA pads 78 are provided on the surface 59a of the circuit element layer 59, along another side of the semiconductor chip 13-2 which is opposite to the side along which the n pieces of third data pads 77 are provided. Although not illustrated, the plurality of CA pads 78 are arranged in the direction D shown in FIG. 7. The CA pads 78 are electrically connected to circuit elements (not illustrated) that are provided on the circuit element layer 59.

The plurality of CA pads 78 are connected to respective ones of the internal CA terminals 33 by bonding wires 82. Thus, the CA pads 78 are electrically connected to the external CA terminals 36 via the bonding wires 82 and the third wiring patterns 34 (see FIG. 2).

A semiconductor memory chip, a controller other than a memory, or the like can be used as the third semiconductor chip 13-2. A DRAM, SRAM, PRAM, a flash memory, or the like can be used as the semiconductor memory chip. In the first embodiment, a case, in which a 16-bit I/O DRAM (2-Gbit capacity) is used as the third semiconductor chip 13-2, similarly to the case of the second semiconductor chip 13-1, is explained below.

Referring to FIG. 1, the sealing resin 17 covers the second surface 18b of the main substrate 18, thereby sealing the first to third semiconductor chips 14, 13-1, and 13-2, the first and second spacers 15-1 and 15-2, and the bonding wires 64, 66, 73, 74 (not illustrated in FIG. 1), 75, 81 and 82. Molding resin, for example, can be used as the sealing resin 17.

Figure 8:
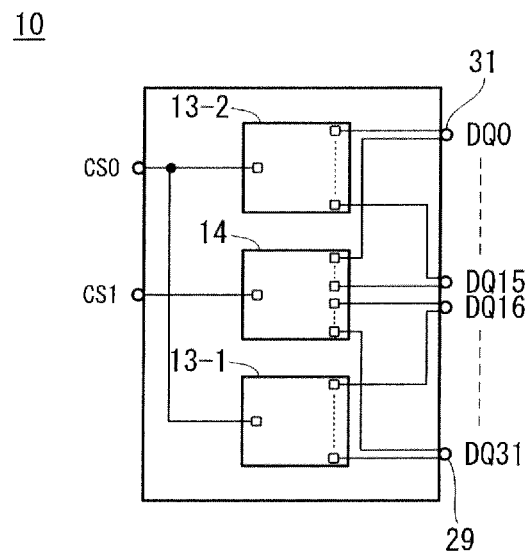
FIG. 8 illustrates chip select signals input to the semiconductor device shown in FIG. 1.

FIG. 8 illustrates a chip select signal input to the semiconductor device of the first embodiment shown in FIG. 1. Like reference numerals denote like elements among FIGS. 1, 2, and 8. Referring to FIG. 8, a first chip select signal CS1 is input to the first semiconductor chip 14. A second chip select signal CS0, which is different from the first chip select signal CS1, is input to the second and third semiconductor chips 13-1 and 13-2.

In other words, in the semiconductor device 10 of the first embodiment, the first semiconductor chip 14 is selected by the first chip select signal CS1, and the second and third semiconductor chips 13-1 and 13-2 are selected by the second chip select signal CS0.

In other words, the semiconductor device 10 of the first embodiment includes: the first semiconductor chip 14, on which the 2n pieces of the first data pads 69 are provided, and to which the first chip select signal CS1 is input; the second semiconductor chip 13-1 on which the n pieces of the second data pads 61 are provided, and to which the second chip select signal CS0 is input; and the third semiconductor chip 13-2, on which the n pieces of the third data pads 77 are provided, and to which the second chip select signal CS0 is input.

In other words, the semiconductor device 10 of the first embodiment, the semiconductor chip 13-1 is configured to supply or receive first data signals respectively to or from the data terminals (DQ16-31) of the wiring board. The semiconductor chip 14 is configured to supply or receive second data signals respectively to or from the data terminals (DO0-31) of the wiring board. The semiconductor chip 13-2 is configured to supply or receive third data signals respectively to or from the data terminals (DQ0-15) of the wiring board. Supplying or receiving the first data signals respectively to or from the data terminals (DQ16-31) of the wiring board is performed in parallel to supplying or receiving the third data signals respectively to or from the data terminals (DQ0-15) of the wiring board.

Figure 9:
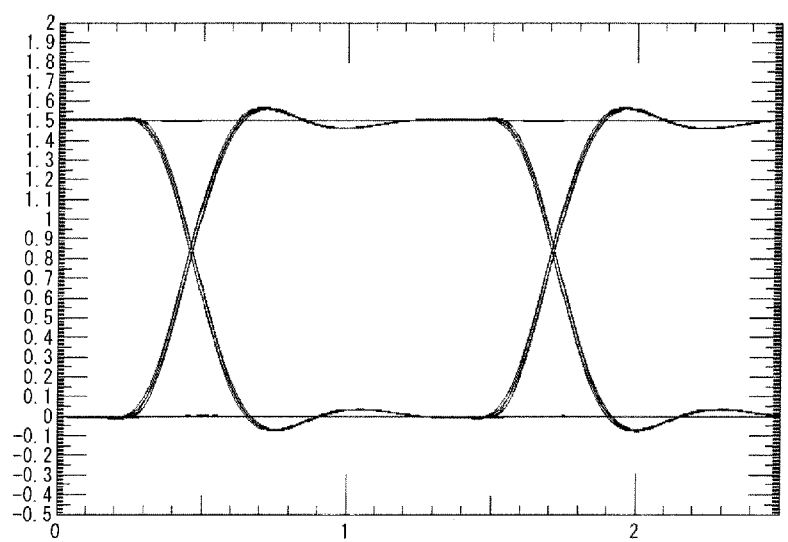
FIG. 9 illustrates the simulation results of a DQ signal in the structure shown in FIG. 4.

FIG. 9 illustrates the results of a simulation of the DQ signal in the structure shown in FIG. 4. The waveforms shown in FIG. 9 can be obtained by: taking multiple samples of transitions of the signal waveforms, using a waveform displaying method called an eye pattern; and overlapping and graphically displaying the results of the sampling.

If the positions of a plurality of waveforms match one another (timing and voltage), it can be concluded that the waveforms are of high quality. On the other hand, if the positions of waveform (timing and voltage) are deviated from one another, it can be concluded that the waveforms have poor quality, causing large jitter. By checking the eye pattern, the timing margin and the voltage margin can be evaluated at one time from the vertical axis (voltage) and horizontal axis (time).

As shown in FIG. 9, the eye pattern of the data signals in the first embodiment (FIG. 2) show that a plurality of data signals overlap one another without deviating from one another, which indicates that the signal quality is good.

According to the semiconductor device 10 of the first embodiment, the first internal data terminals 21 are connected to respective ones of the first wiring patterns 26. The first wiring patterns electrically connect the second internal data terminals 22 and respective ones of the first external data terminals 29. The second internal data terminals 22 are electrically connected to respective ones of the second data pads 61 via the bonding wires 64. The first internal data terminals 21 are electrically connected to respective ones of the n pieces of the first data pads 69 via the bonding wires 73.

Additionally, the third internal data terminals 23 are connected to respective ones of the second wiring patterns 27. The second wiring patterns 27 electrically connect the fourth internal data terminals 24 and respective ones of the second external data terminals 31. The fourth internal data terminals 24 are electrically connected to respective ones of the third data pads 77 via the bonding wires 81. The third internal data terminals 23 are electrically connected to respective ones of the other n pieces of the first data pads 69 via the bonding wires 74.

Accordingly, the first and second wiring patterns 26 and 27 substantially free of branching portions are disposed on the wiring substrate 11. The first wiring patterns 26 electrically connect the first internal data terminals 21, respective ones of the second internal data terminals 22, and respective ones of the first external data terminals 29. The second wiring patterns 27 electrically connect the third internal data terminals 23, respective ones of the fourth internal data terminals 24, and respective ones of the second external data terminals 31. Therefore, there is almost no stub, thereby preventing deterioration in the quality of the data signals in the semiconductor device 10.

Figure 10:
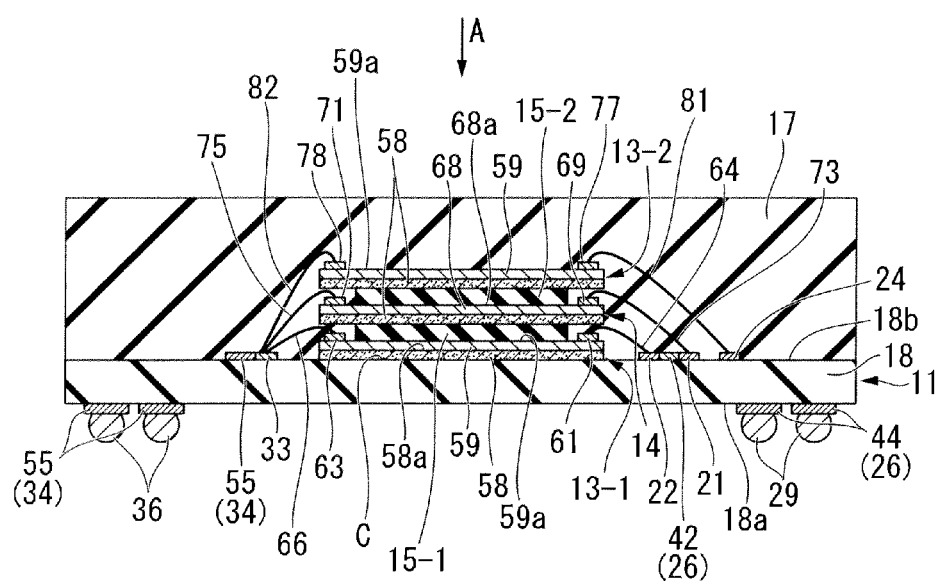
FIG. 10 is a cross-sectional view illustrating a modified example of the semiconductor device of the first embodiment.
Figure 11:
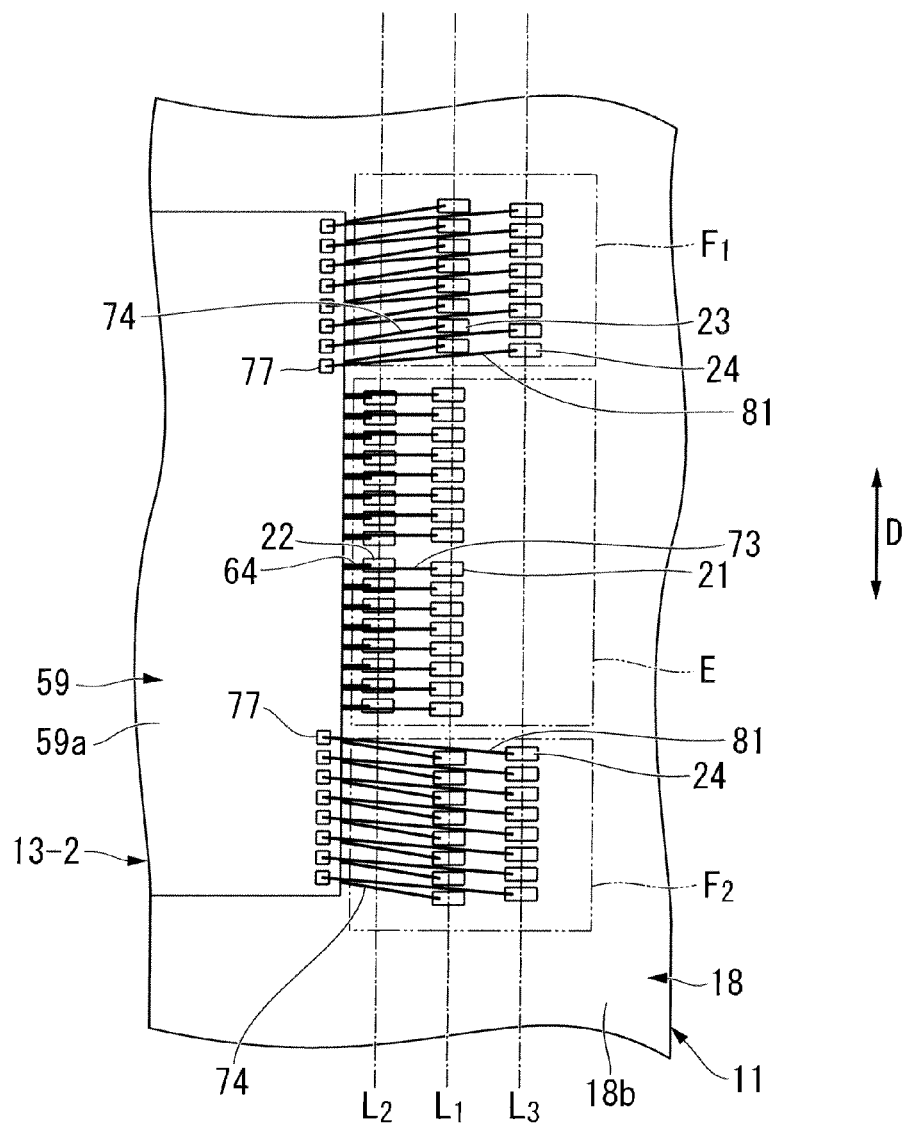
FIG. 11 is a plan view illustrating main part of the semiconductor device of the modified example, from which a sealing resin shown in FIG. 10 is removed.

FIG. 10 is a cross-sectional view illustrating a structure of a semiconductor device 90 according to a modification of the first embodiment of the present invention. FIG. 11 is a plan view (viewed in a direction A shown in FIG. 10) illustrating main part of the semiconductor device 90, from which the sealing resin shown in FIG. 10 removed.

Figure 12:
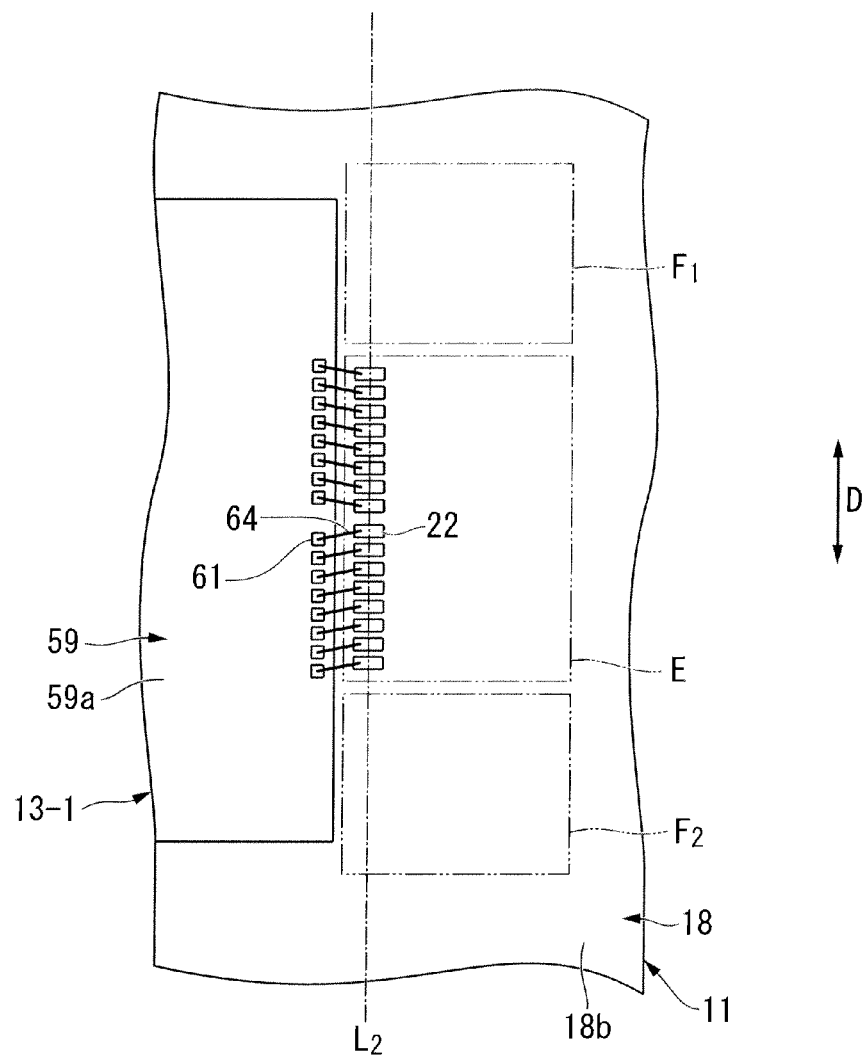
FIG. 12 is a plan view illustrating the positions of second data pads on a second semiconductor chip shown in FIG. 10.
Figure 13:
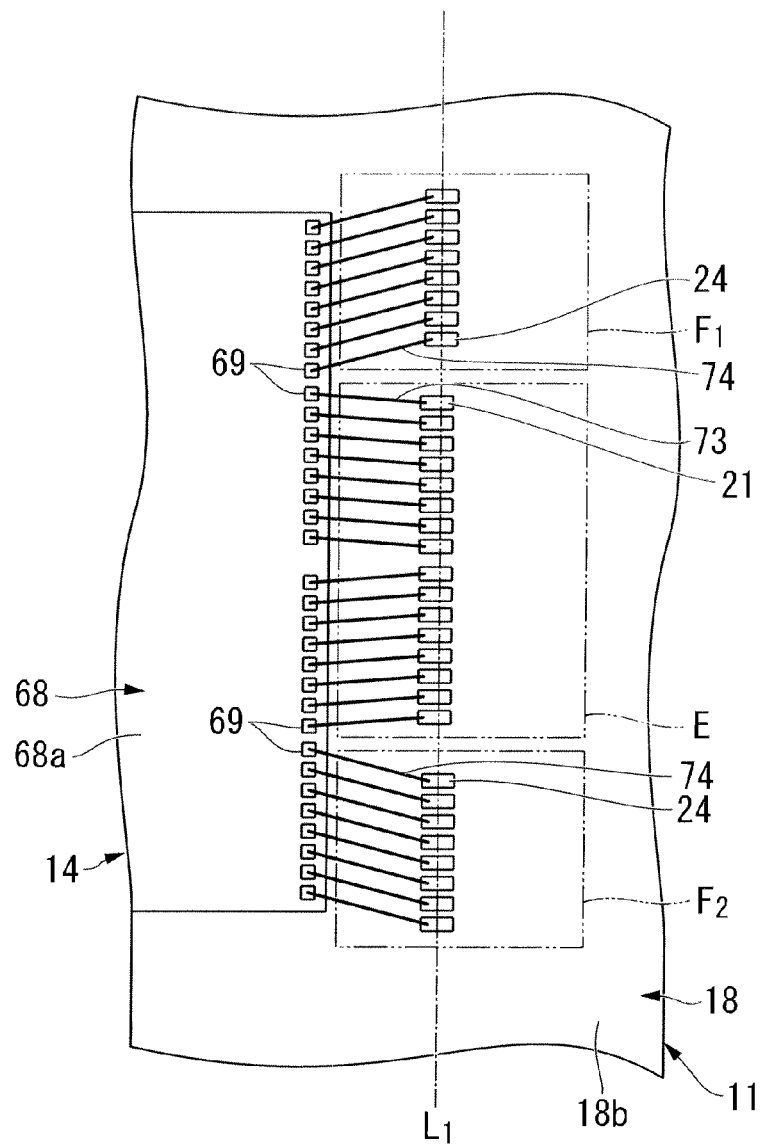
FIG. 13 is a plan view illustrating the positions of first data pads on a first semiconductor chip shown in FIG. 10.
Figure 14:
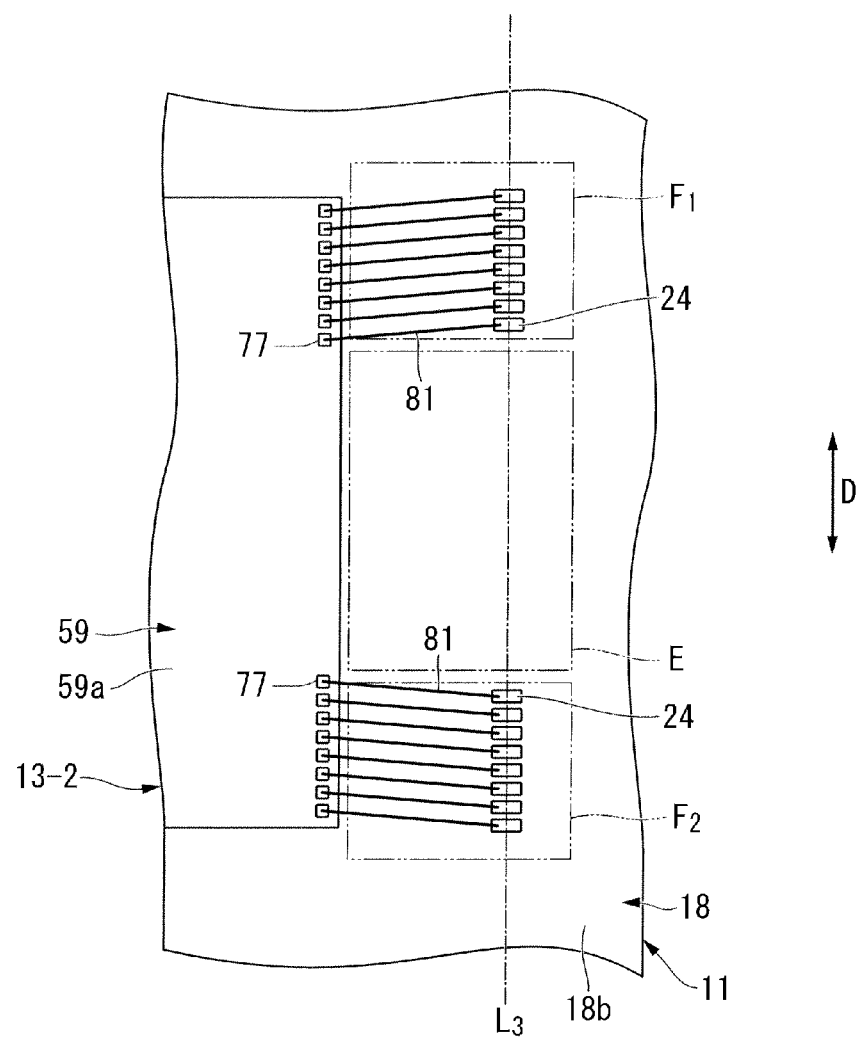
FIG. 14 is a plan view illustrating the positions of third data pads on a third semiconductor chip shown in FIG. 10.

FIG. 12 is a plan view illustrating the positions of the second data pads provided on the second semiconductor chip shown in FIG. 10. FIG. 13 is a plan view illustrating the positions of the first data pads provided on the first semiconductor chip shown in FIG. 10. FIG. 14 is a plan view illustrating the positions of the third data pads provided on the third semiconductor chip shown in FIG. 10. Like reference numerals denote like elements among FIGS. 10 to 14.

Referring to FIGS. 10 to 14, the semiconductor device 90 according to the modification of the first embodiment differs from the semiconductor device 10 of the first embodiment only in that the positions of the n pieces of the third data pads 77 of the third semiconductor chip 13-2 on the semiconductor device 10 are changed.

Referring to FIG. 14, regarding the third semiconductor chip 13-2, among the n pieces of the third data pads 77, n/2 pieces of the third data pads 77 are disposed adjacent to the first peripheral region $F_1$. Additionally, the other n/2 pieces of the third data pads 77 are disposed adjacent to the second peripheral region $F_2$.

Thus, the third data pads 77 are disposed adjacent to the first and second peripheral regions $F_1$ and $F_2$. Accordingly, the angle formed in plan view between a line perpendicular to the D direction and each bonding wire 81 can be decreased more than in the case of FIG. 7, thereby making it easier to form the bonding wires 81 using a bonding machine (not shown).

Additionally, the semiconductor device 90 according to the modification of the first embodiment can achieve the similar effect to that achieved by the semiconductor device 10 of the first embodiment. Specifically, it is possible to prevent the deterioration of the data signal quality in the semiconductor device 90.

Second Embodiment

Figure 15:
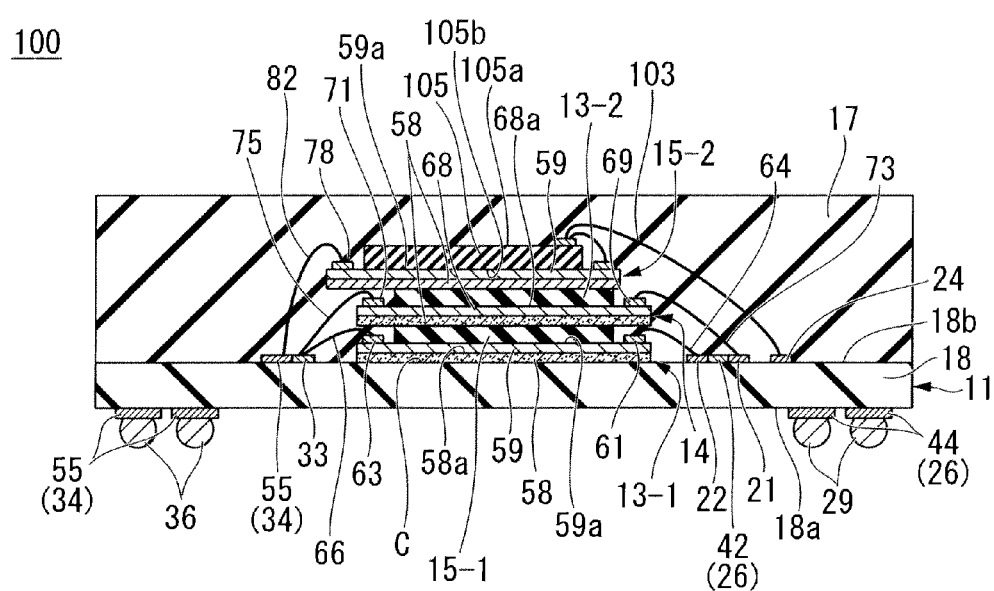
FIG. 15 is a cross-sectional view illustrating a configuration of a semiconductor device according to a second embodiment of the present invention.
Figure 16:
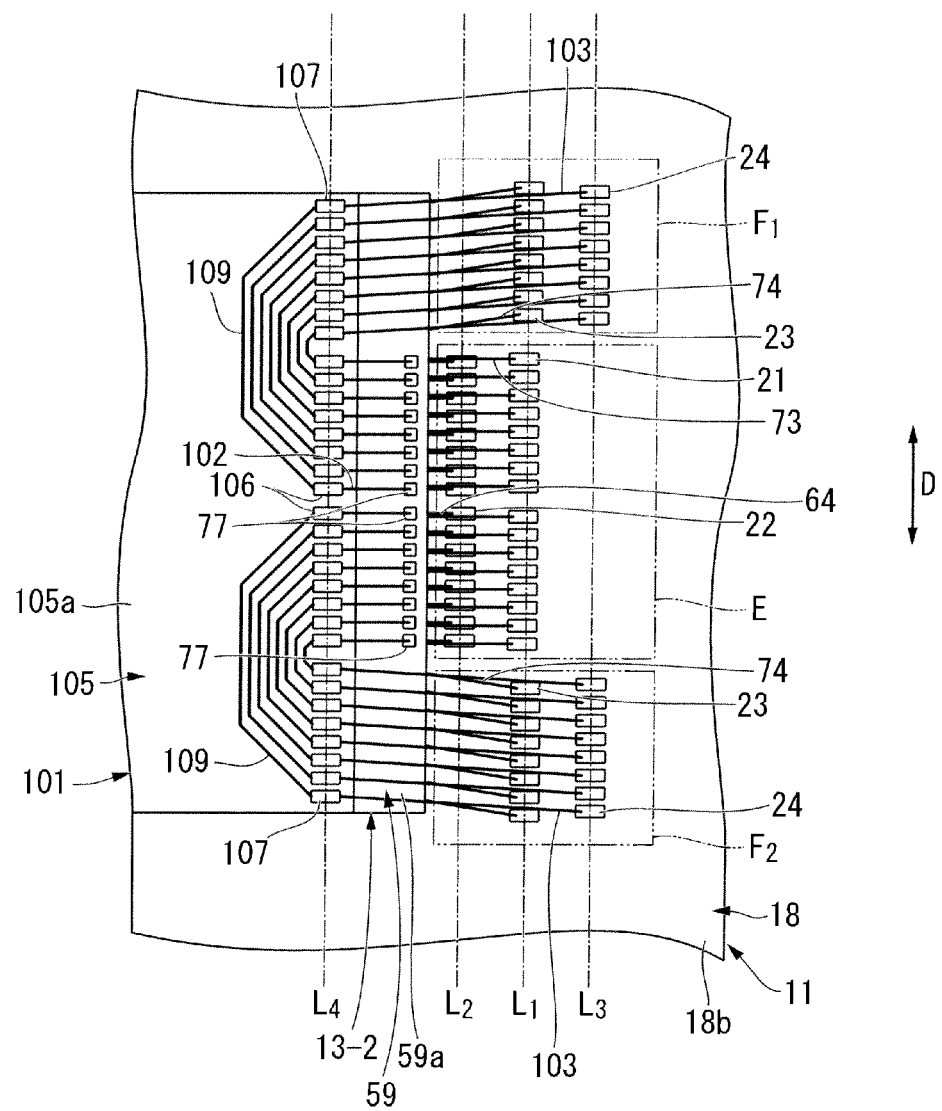
FIG. 16 is a plan view illustrating the semiconductor device of the second embodiment, from which a sealing resin shown in FIG. 15 is removed.
Figure 17:
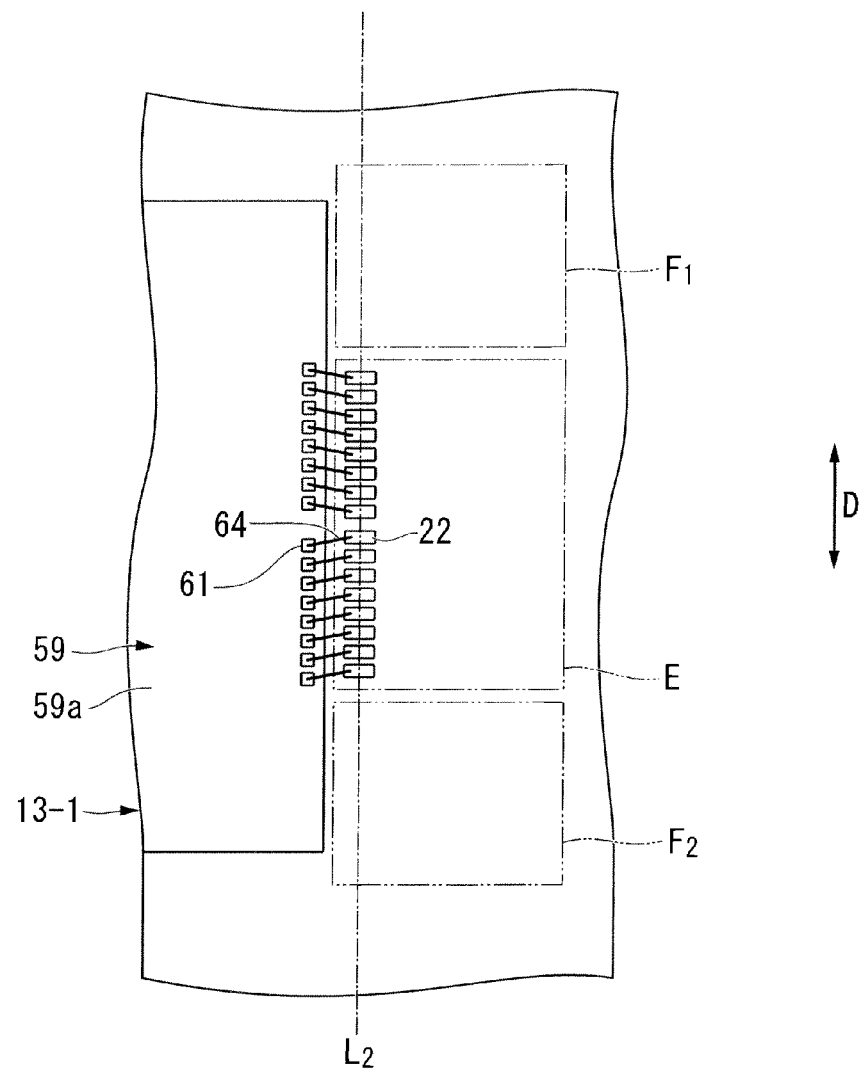
FIG. 17 is a plan view illustrating the positions of second data pads on a second semiconductor chip shown in FIG. 15.

FIG. 15 is a cross-sectional view illustrating a structure of a semiconductor device 100 according to a second embodiment of the present invention. FIG. 16 is a plan view (viewed in the direction A shown in FIG. 15) illustrating a main part of the semiconductor device 100 of the second embodiment, from which the sealing resin shown in FIG. 15 is removed. FIG. 17 is a plan view illustrating the positions of the second data pads provided on a second semiconductor chip shown in FIG. 15.

Figure 18:
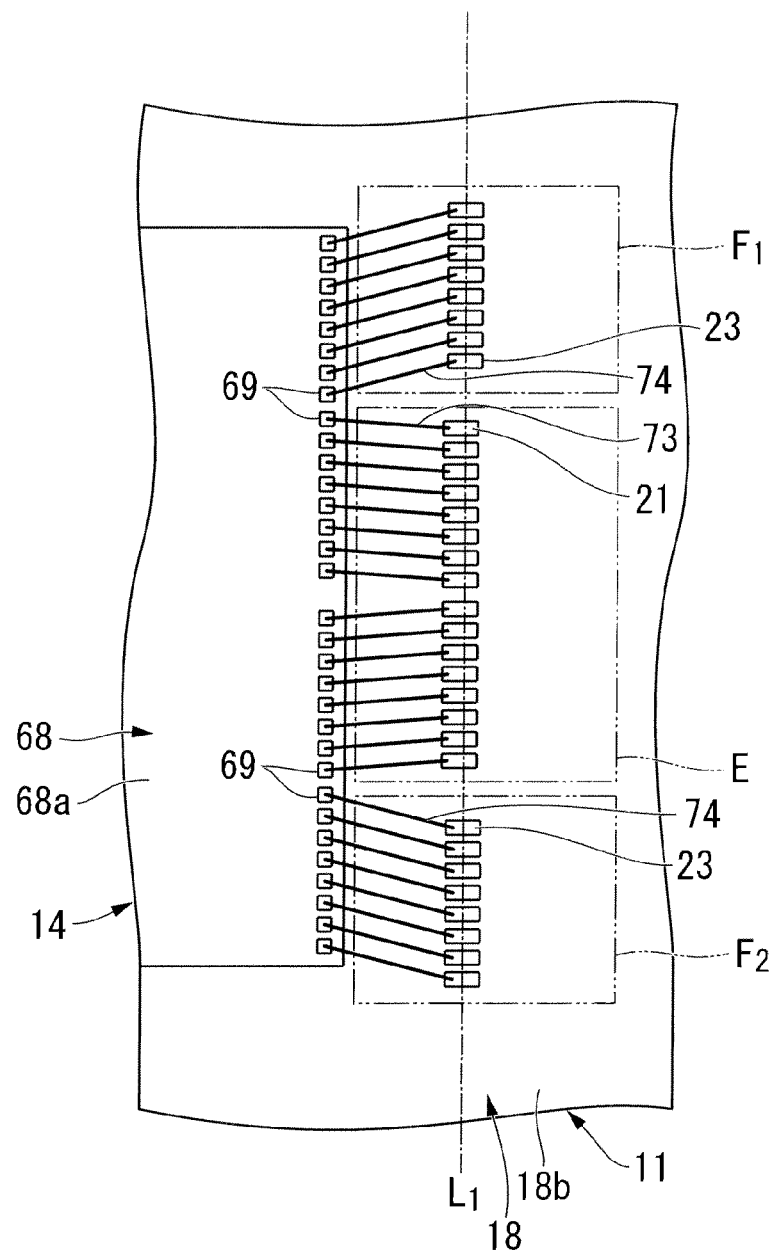
FIG. 18 is a plan view illustrating the positions of first data pads on a first semiconductor chip shown in FIG. 15.
Figure 19:
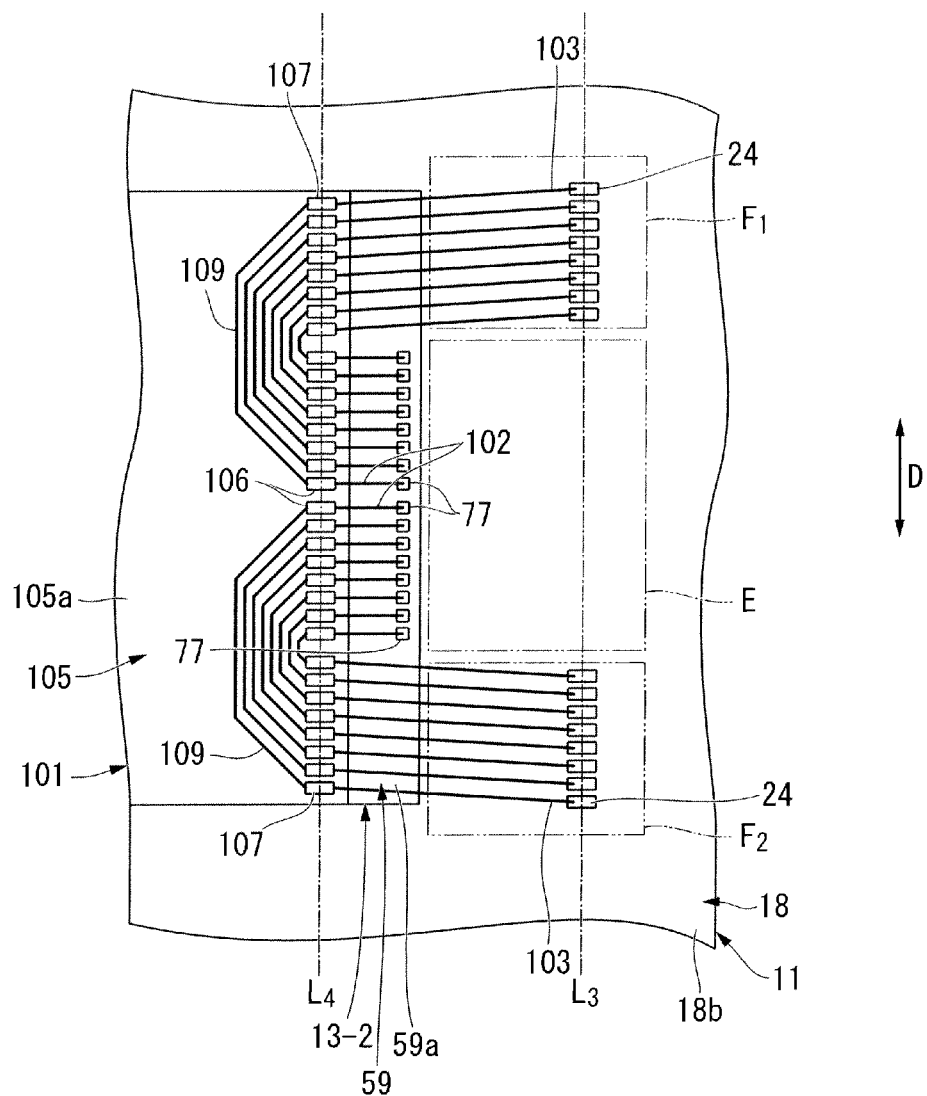
FIG. 19 is a plan view illustrating third data pads, first pads, second pads, and wires, which are shown in FIG. 15.

FIG. 18 is a plan view illustrating the positions of the first data pads provided on a first semiconductor chip shown in FIG. 15. FIG. 19 is a plan view illustrating third data pads, the first pads, the second pads, and wires, which are shown in FIG. 15. Like reference numerals denote like elements among FIGS. 10 to 19. Wires 109 shown in FIG. 16 which are constituent elements of a second wiring substrate 101 are shown in FIG. 15.

Referring to FIGS. 15 to 19, the semiconductor device 100 of the second embodiment differs from the semiconductor device 90 of the modification of the first embodiment only in that the bonding wire 81 included in the semiconductor device 90 is not provided, and a second wiring substrate 101 and bonding wires 102 and 103 are additionally provided.

The second wiring substrate 101 includes: a main substrate 105; n pieces of first pads 106 (where n is an integer of 2 or larger); n pieces of second pads 107; and n pieces of wires 109. The second wiring substrate 101 is fixed onto an upper surface 59a of a circuit element layer 59 of a third semiconductor chip 13-2 (the semiconductor chip on the uppermost layer), so that the first pads 106, the second pads 107, and the wires 109 face upward.

The main substrate 105 is a rectangular insulating board having a size such that the main substrate 105 can be mounted on the upper surface 59a of the circuit element layer 59 provided on the third semiconductor chip 13-2.

A surface 105b of the main substrate 105, which is opposite to the main surface 105a (the main surface of the second wiring substrate 101), is fixed onto the upper surface 59a of the circuit element layer 59 of the third semiconductor chip 13-2. For example, a fiberglass epoxy substrate can be used as the main substrate 105.

Referring to FIG. 19, the n pieces of the first pads 106 are provided on the main surface 105a of the main substrate 105. The n pieces of the first pads 106 are disposed adjacent to the center region E, on a fourth line L4 extending in the direction D.

The n pieces of the second pads 107 are provided on the main surface 105a of the main substrate 105. Among the n pieces of the second pads 107, n/2 pieces of the second pads 107 are disposed on the fourth line L4, adjacent to the first peripheral region $F_1$. The other n/2 pieces of the second pads 107 are disposed on the fourth line L4, adjacent to the second peripheral region $F_2$.

On the other hand, the first and second pads 106 and 107 are disposed on the fourth line L4. The n pieces of the first pads 106 are disposed between the two sets of the n/2 pieces of second pads 107.

The n pieces of the wires 109 are provided on the main surface 105a of the main substrate 105. One end of each wire 109 is connected to the first pad 106, and the other end of the wire 109 is connected to the second pad 107. Thus, the wires 109 electrically connect the first pads 106 and respective ones of the second pads 107.

One end of each bonding wire 102 is connected to a third data pad 77 and the other end thereof is connected to the first pad 106. Thus, the bonding wires 102 electrically connect the third data pads 77 and respective ones of the first pads 106.

One end of each bonding wire 103 is connected to a fourth internal data terminal 24, and the other end thereof is connected to a second pad 107. Thus, the bonding wires 103 electrically connect the fourth internal data terminals 24 and respective ones of the second pads 107.

According to the second embodiment, the bonding wires 102 and 103 can be more easily formed than in the case of forming the bonding wire 81 provided in the semiconductor device 10 of the first embodiment shown in FIG. 7.

Additionally, the semiconductor device 100 of the second embodiment can achieve a similar effect to that achieved by the semiconductor device 10 of the first embodiment. Specifically, it is possible to prevent the deterioration in the quality of the data signals in the semiconductor device 100.

Third Embodiment

Figure 20:
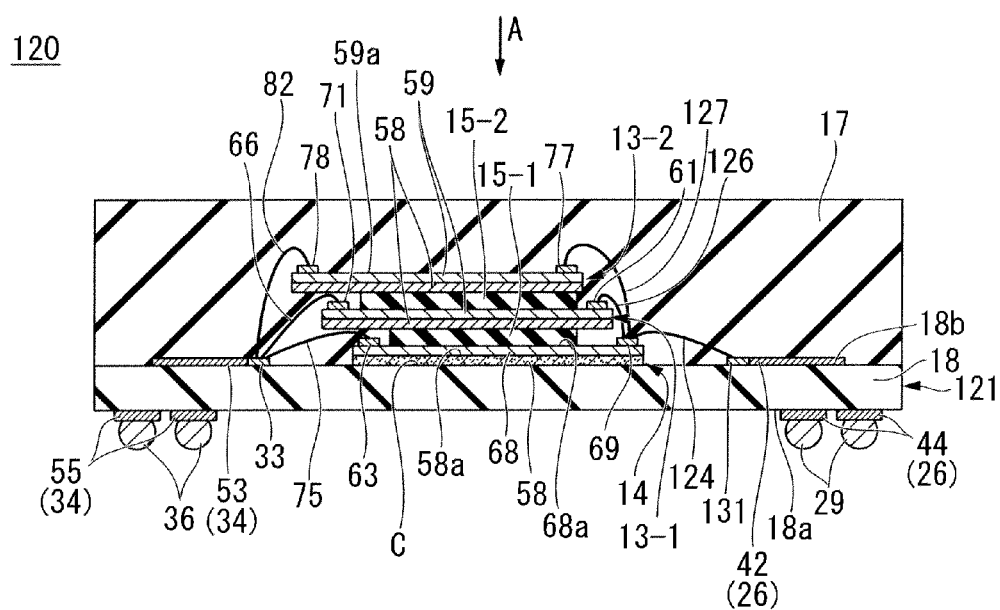
FIG. 20 is a cross-sectional view illustrating a configuration of a semiconductor device according to a third embodiment of the present invention.
Figure 21:
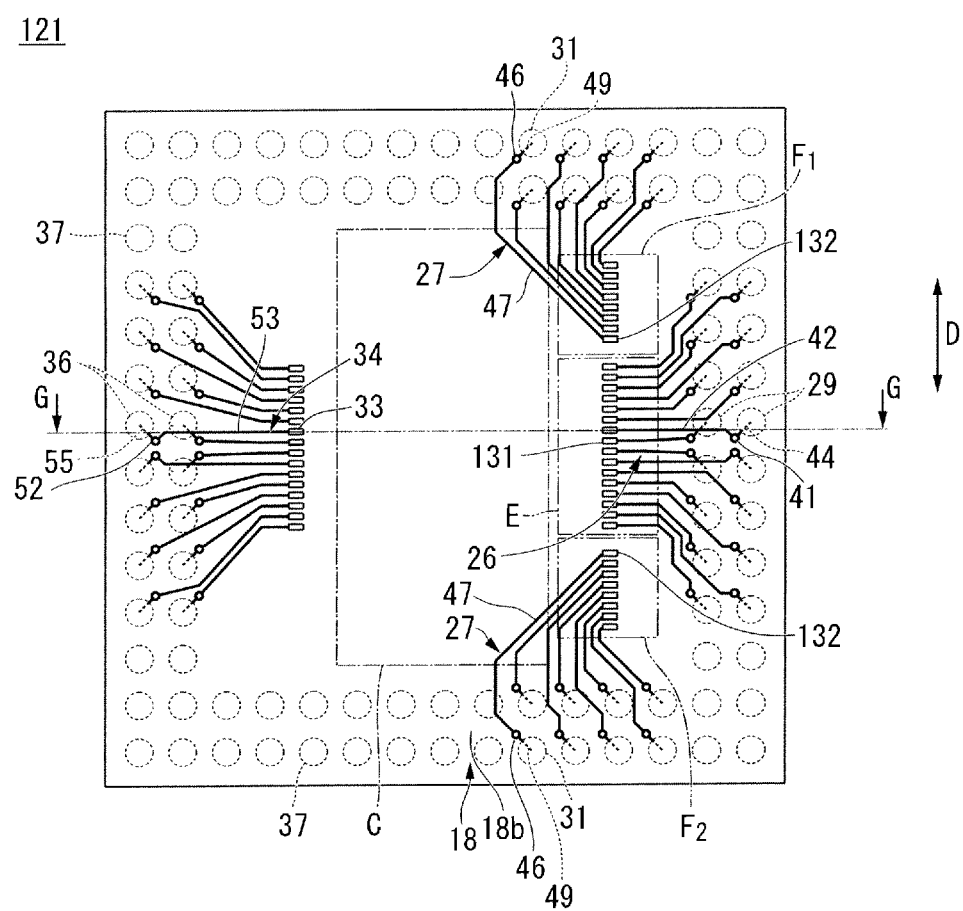
FIG. 21 is a plan view illustrating a wiring substrate shown in FIG. 20.

FIG. 20 is a cross-sectional view illustrating a structure of a semiconductor device 120 according to a third embodiment of the present invention. FIG. 21 is a plan view illustrating a wiring substrate shown in FIG. 20, which is viewed in a direction A shown in FIG. 20.

The cross-section of the semiconductor device 120 shown in FIG. 20 corresponds to a cross-section taken along a line G-G shown in FIG. 21. Like reference numerals denote like elements between the modification of the first embodiment and the third embodiment.

Referring to FIGS. 20 and 21, the semiconductor device 120 differs from the semiconductor device 90 only in that a wiring substrate 121 and bonding wires 124 to 127 are provided instead of the first wiring substrate 11 and the bonding wires 64, 73 to 75, and 81 which are included in the semiconductor device 90, and that the first semiconductor chip 14, the second semiconductor chip 13-1, and the third semiconductor chip 13-2 are mounted in this order over the wiring substrate 121 (the second surface 18b of the main substrate 18).

Referring to FIG. 20, the second semiconductor chip 13-1 is stacked over the first semiconductor chip 14 while being slightly shifted towards internal CA terminals 33 with respect to the first semiconductor chip 14. The third semiconductor chip 13-2 is stacked over the second semiconductor chip 13-1 while being slightly shifted towards the internal CA terminals 33 with respect to the second semiconductor chip 13-1.

Referring to FIGS. 20 and 21, the wiring substrate 121 differs from the first wiring substrate 11 only in that n pieces of first internal data terminals 131 and n pieces of second internal data terminals 132 are provided on the wiring substrate 121, instead of the first to fourth internal data terminals 21 to 24 which are provided on the first wiring substrate 11.

Figure 22:
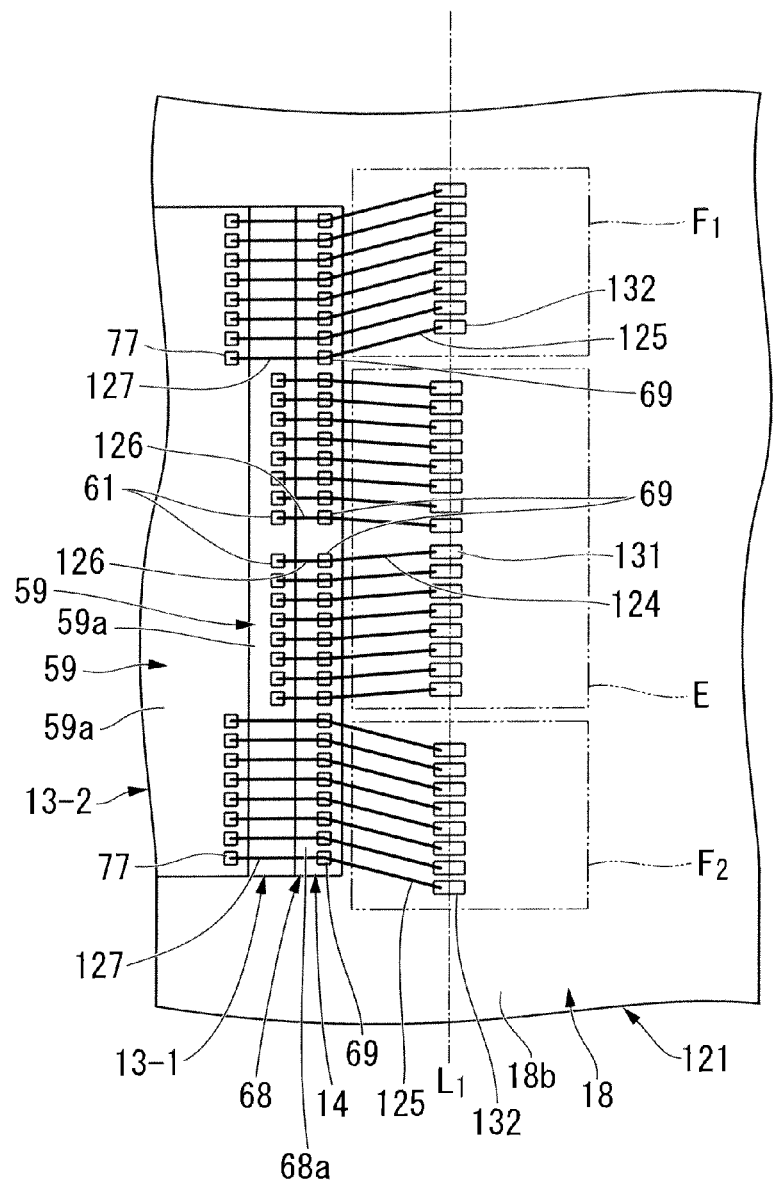
FIG. 22 is a plan view illustrating main part of a semiconductor device of the third embodiment, from which a sealing resin shown in FIG. 21 is removed.

FIG. 22 is a plan view illustrating a main part of the semiconductor device 120, from which the sealing resin shown in FIG. 21 removed, which is viewed in the direction A shown in FIG. 21. Like reference numerals denote like elements among FIGS. 11, 20 to 22.

Referring FIG. 22, the n pieces of the first internal data terminals 131 are provided in the center region E, on the first straight line $L_1$ extending in the direction D. The n/2 pieces of the second internal data terminals 132 are provided in the first peripheral region $F_1$. The other n/2 pieces of the second internal data terminals 132 are provided in the second peripheral region $F_2$. The n pieces of the second internal data terminals 132 and the n pieces of the first internal data terminals 131 are disposed on the first straight line $L_1$. The n pieces of the first internal data terminals 131 are disposed between the two sets of the n/2 pieces of the second internal data terminals 132.

Referring to FIGS. 20 and 21, one end of the first wiring pattern 26 is connected to the first internal data terminal 131, and the other end thereof is connected to the first external data terminal 29. Thus, the first wiring patterns 26 electrically connect the first internal data terminals 131 and respective ones of the first external data terminals 29.

The first wiring pattern 26 is a wiring pattern substantially free of branching portion and, and therefore there is almost no stub, thereby preventing the deterioration of signal quality.

Referring to FIG. 21, one end of the second wiring pattern 27 is connected to the second internal data terminal 132, and the other end thereof is connected to a second external data terminal 31. Thus, the second wiring patterns 27 electrically connect the second internal data terminals 132 and respective ones of the second external data terminals 31. The second wiring pattern 27 is a wiring pattern substantially free of branching portions, and therefore there is almost no stub, thereby preventing the deterioration of signal quality.

Referring to FIG. 22, one end of the bonding wire 124 is connected to the first internal data terminal 131, and the other end thereof is connected to the data pad 69 (one of the n pieces of the first data pads 69) that is disposed adjacent to the center region E. Thus, the bonding wires 124 electrically connect the first internal data terminals 131 and respective ones of the first data pad 69 adjacent to the center region E.

One end of the bonding wire 125 is connected to the second internal data terminal 132, and the other end thereof is connected to the first data pad 69 (one of the other n pieces of the first data pads 69) that is disposed adjacent to the first or second peripheral region $F_1$ or $F_2$. Thus, the bonding wires 125 electrically connect the second internal data terminals 132 and respective ones of the first data pad 69 adjacent to the first and second peripheral regions $F_1$ and $F_2$.

One end of the bonding wire 126 is connected to a second data pad 61, and the other end thereof is connected to the first data pad 69 that is disposed adjacent to the center region E. Thus, the bonding wires 126 electrically connect the second data pads 61 and respective ones of the first data pad 69 adjacent to the center region E.

One end of the bonding wire 127 is connected to the third data pad 77, and the other end thereof is connected to the first data pad 69 that is disposed adjacent to the first or second peripheral circuit regions $F_1$ or $F_2$. Thus, the bonding wires 127 electrically connect the third data pads 77 and respective ones of the first data pad 69 disposed adjacent to the first and second peripheral circuit regions $F_1$ and $F_2$.

According to the semiconductor device 120 of the third embodiment, the first wiring patterns 26, which electrically connect the first internal data terminals 131 and the first external data terminals 29, and second wiring patterns 27, which electrically connect the second internal data terminals 132 and the second external data terminals 31 are substantially free of branching portions. Therefore, there is almost no stub, thereby preventing deterioration of signal quality.

It is apparent that the present invention is not limited to the above embodiments, and may be modified and changed without departing from the scope and spirit of the invention.

For example, the case, in which a 32-bit I/O semiconductor memory chip is used as the first semiconductor chip 14 included in the semiconductor devices 10, 90, 100, and 120, has been explained in the first to third embodiments. Alternatively, for example, a 64-bit I/O semiconductor memory chip may be used as the first semiconductor chip 14.

Additionally, the positions of the first data pads 69 provided on the first semiconductor chip 14, the second data pads 61 provided on the second semiconductor chip 13-1, and the third data pads 77 provided on the third semiconductor chip 13-2 are not limited to the positions of the first to third data pads 69, 61, and 77, which are explained in the first to third embodiments.

The present invention is applicable to the semiconductor device.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

What is claimed is:

1. A semiconductor device comprising:
a wiring board including first and second chip select terminals which receive first and second chip select signals, respectively;
first, second, and third chips stacked over the wiring board with one another, the first and third chips being connected to the first chip select terminal and disconnected from the second chip select terminal so that the first and third chips are activated simultaneously in response to the first chip select signal from the first chip select terminal, the second chip being sandwiched between the first and third chips, the second chip being connected to the second chip select terminal and disconnected from the first chip select terminal so that the second chip is activated in response to the second chip select signal from the second chip select terminal; and
a sealing resin cooperating with the wiring board to house the first, second, and third chips therein, wherein
the wiring board further includes a plurality of data terminals,
the first, second, and third chips include a plurality of first, second, and third data pads, respectively,
the first data pads of the first chip are electrically coupled and directly connected to ones of the data terminals, respectively,
the third data pads of the third chip are electrically coupled and directly connected to remaining ones of the data terminals, respectively, and
the second data pads of the second chip are electrically coupled and directly connected to the ones and remaining ones of the data terminals, respectively.

2. The semiconductor device according to claim 1, wherein the first, second, and third chips further include first, second, and third command pads, respectively, and
the wiring board further includes a command terminal coupled to the first, second, and third command pads in common.

3. The semiconductor device according to claim 1, wherein the first data pads overlap at least partially the third data pads, respectively, in plan view.

4. The semiconductor device according to claim 1, wherein the number of the first pads is equal to the number of the third pads.

5. The semiconductor device according to claim 4, wherein the number of the second pads is twice the number of the first pads.

6. The semiconductor device according to claim 1, wherein the second chip is sandwiched between the first and third chips.

* * * * *